US008921188B2

(12) United States Patent
Asra

(10) Patent No.: US 8,921,188 B2
(45) Date of Patent: Dec. 30, 2014

(54) METHODS OF FORMING A TRANSISTOR DEVICE ON A BULK SUBSTRATE AND THE RESULTING DEVICE

(71) Applicant: GLOBALFOUNDRIES Inc., Grand Cayman (KY)

(72) Inventor: Ram Asra, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/761,686

(22) Filed: Feb. 7, 2013

(65) Prior Publication Data

US 2014/0217544 A1    Aug. 7, 2014

(51) Int. Cl.
| H01L 21/336 | (2006.01) |
| H01L 21/762 | (2006.01) |
| H01L 21/8234 | (2006.01) |
| H01L 21/8238 | (2006.01) |

(52) U.S. Cl.
CPC .... *H01L 21/76224* (2013.01); *H01L 21/76283* (2013.01); *H01L 21/823412* (2013.01); *H01L 21/823878* (2013.01); *H01L 21/823807* (2013.01); *H01L 21/823481* (2013.01)
USPC ........... 438/296; 438/294; 438/424; 438/430; 438/589; 438/700; 257/506; 257/510; 257/E21.09; 257/E21.54; 257/E21.546; 257/E21.561; 257/E27.112

(58) Field of Classification Search
CPC ................... H01L 27/10876; H01L 27/10823; H01L 27/1203; H01L 29/66651; H01L 29/7824; H01L 21/76224; H01L 21/823481; H01L 21/823412; H01L 21/76283; H01L 21/823807; H01L 21/823878
USPC ....... 257/E21.546, E21.09, E21.54, E27.112, 257/E21.561, 506, 510; 438/589, 424, 296, 438/700, 294, 430
See application file for complete search history.

(56) References Cited

U.S. PATENT DOCUMENTS

| 5,343,051 | A | 8/1994 | Yamaguchi et al. | |
| 6,642,130 | B2 * | 11/2003 | Park ............................ | 438/589 |
| 6,852,559 | B2 * | 2/2005 | Kwak et al. ................ | 438/44 |
| 8,482,069 | B2 * | 7/2013 | Yamazaki et al. .......... | 257/347 |
| 8,691,651 | B2 * | 4/2014 | Dai et al. ..................... | 438/275 |
| 2005/0196947 | A1 * | 9/2005 | Seo et al. .................... | 438/589 |
| 2006/0249756 | A1 * | 11/2006 | Matsumoto et al. ........ | 257/224 |
| 2006/0278951 | A1 * | 12/2006 | Kim ............................. | 257/506 |
| 2011/0109828 | A1 * | 5/2011 | Kim et al. .................... | 349/46 |
| 2012/0043593 | A1 * | 2/2012 | Zhong et al. ................ | 257/288 |
| 2013/0264653 | A1 * | 10/2013 | Cai et al. ..................... | 257/369 |

* cited by examiner

*Primary Examiner* — Bac Au
(74) *Attorney, Agent, or Firm* — Amerson Law Firm, PLLC

(57) ABSTRACT

One illustrative method disclosed herein includes forming a trench within an isolated region of a bulk semiconductor substrate, forming a region of an insulating material in the trench and forming a semiconductor material within the trench and above the upper surface of the region of insulating material. A substrate disclosed herein includes an isolated substrate region in a bulk semiconductor substrate, a region of an insulating material that is positioned within a trench defined in the isolated substrate region and a semiconductor material positioned within the trench and above the upper surface of the region of insulating material.

27 Claims, 7 Drawing Sheets

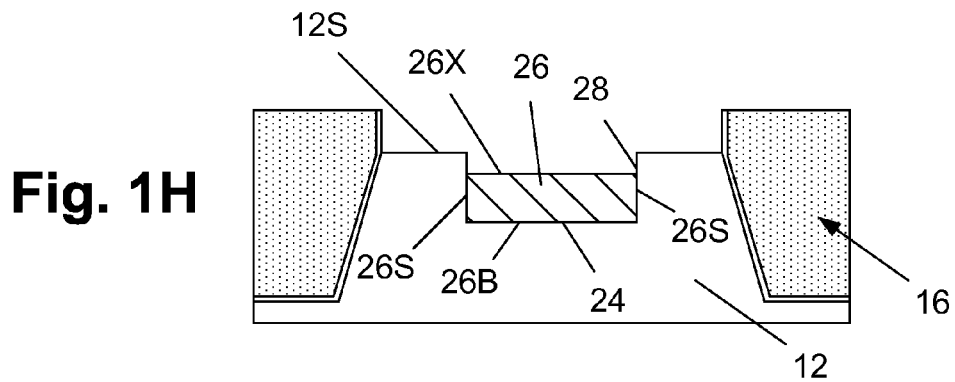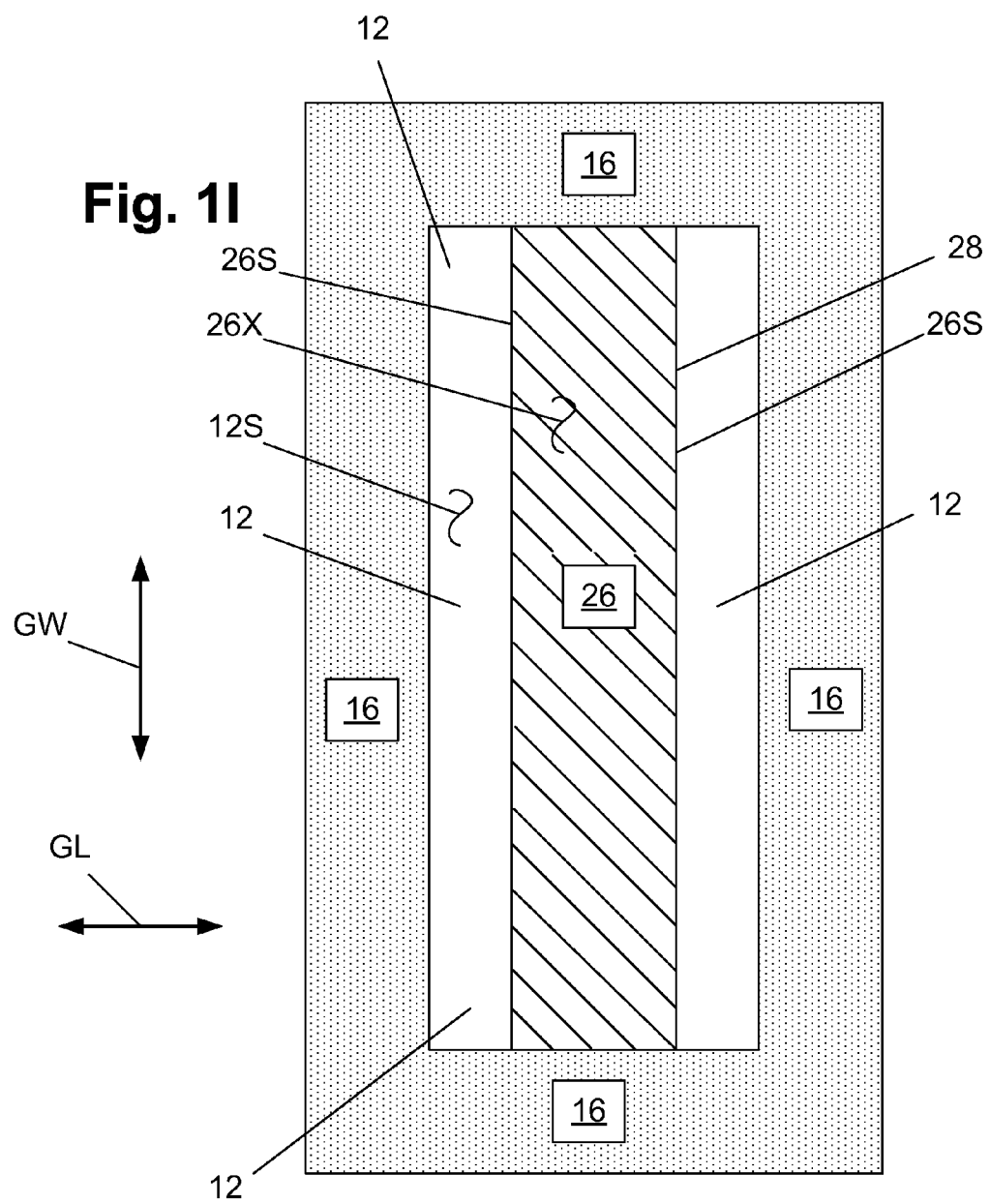

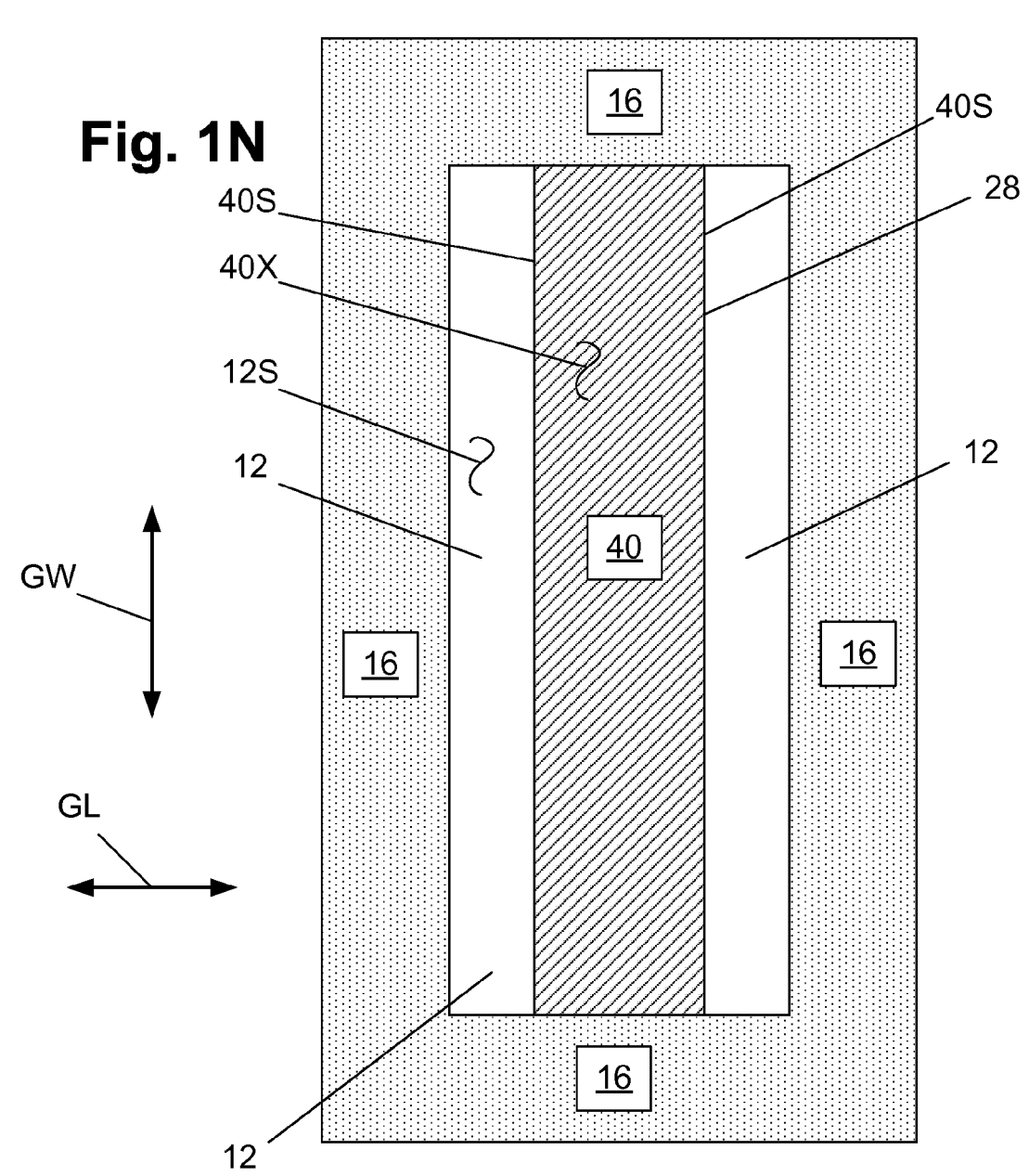

METHODS OF FORMING A TRANSISTOR DEVICE ON A BULK SUBSTRATE AND THE RESULTING DEVICE

BACKGROUND OF THE INVENTION

1. Field of the Invention

Generally, the present disclosure relates to the manufacture of sophisticated semiconductor devices, and, more specifically, to various methods of forming a transistor device on a bulk semiconductor substrate and the resulting substrate structures and transistor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If the voltage applied to the gate electrode is less than the threshold voltage ($V_t$) of the device, then there is no current flow through the device (ignoring undesirable leakage currents, which are hopefully relatively small). However, when the voltage applied to the gate electrode equals or exceeds the threshold voltage ($V_t$) of the device, the channel region becomes conductive, and electrical current is permitted to flow between the source region and the drain region through the conductive channel region. During the fabrication of complex integrated circuit products using, for instance, CMOS technology, millions of transistors, e.g., N-channel transistors (NFET) and/or P-channel transistors (PFET), are formed on a substrate including a crystalline semiconductor layer.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

Device designers are under constant pressure to increase the operating speed and electrical performance of transistors and integrated circuit products that employ such transistors. Given that the gate length (the distance between the source and drain regions) on modern transistor devices may be approximately 20-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure, etc.

One particular technique that has been employed in an effort to reduce or eliminate short channel effects has been to form the transistor devices on so-called silicon-on-insulator (SOI) substrates. In general, an SOI substrate is comprised of a bulk semiconducting substrate, a thin so-called active layer comprised of a semiconducting material positioned above the bulk substrate and a buried insulation layer ("BOX" layer) positioned between the bulk substrate and the active layer. Semiconductor devices, such as transistors, are formed in the active layer of an SOI substrate. As compared to transistor devices that are formed in a bulk semiconductor substrate, transistors formed in an active layer of an SOI substrate are fully insulated, due to the presence of the BOX layer. This structure improves device performance and can reduce some undesirable short channel effects. While transistor devices manufactured on SOI substrates may exhibit improved performance characteristics, SOI substrates are significantly more expensive than bulk semiconductor substrates, thereby increasing the cost of manufacturing integrated circuit products using SOI substrates. What is needed is a way to manufacture transistor devices on lower-cost bulk semiconductor substrates, wherein the transistor devices exhibit acceptable electrical performance characteristics and the manufacturing techniques used to make the transistor devices are compatible with existing processing tools and techniques.

The present disclosure is directed to various methods of forming transistor devices on a bulk semiconductor substrate and the resulting substrate structures and transistor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a transistor device on a bulk semiconductor substrate and the resulting substrate structures and transistor devices. One illustrative method disclosed herein includes forming an isolation region in a bulk semiconductor substrate, wherein the isolation region defines an isolated substrate region, forming a trench in the isolated substrate region, forming a region of an insulating material in the trench, wherein the region of insulating material has an upper surface that is at a level that is below a level of an upper surface of the isolated substrate region, and forming a semiconductor material within the trench and above the upper surface of the region of insulating material, wherein the semiconductor material has an upper surface that is substantially planar with the upper surface of the isolated substrate region.

One illustrative bulk substrate disclosed herein includes an isolation region positioned at least partially in the bulk semiconductor substrate, wherein the isolation region defines an isolated substrate region, a region of an insulating material that is positioned within a trench defined in the isolated substrate region, wherein the region of insulating material has an upper surface that is at a level that is below a level of an upper surface of the isolated substrate region, and a semiconductor material positioned within the trench and above the upper surface of the region of insulating material, wherein the semiconductor material has an upper surface that is substantially planar with the upper surface of the isolated substrate region.

BRIEF DESCRIPTION OF THE DRAWINGS

The disclosure may be understood by reference to the following description taken in conjunction with the accompanying drawings, in which like reference numerals identify like elements, and in which.

Figure 1A:
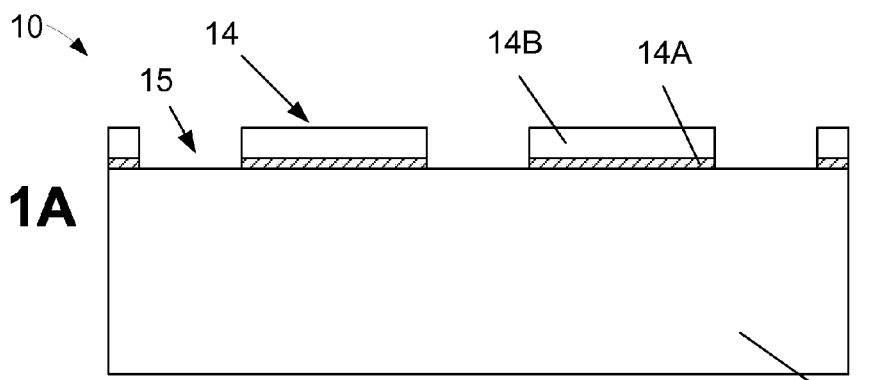
FIGS. 1A-1R depict various illustrative methods disclosed herein of forming a transistor device on a bulk semiconductor substrate and the resulting substrate structures and transistor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a transistor device on a bulk semiconductor substrate and the resulting substrate structures and transistor devices. As will be readily apparent to those skilled in the art upon a complete reading of the present application, the present methods are applicable to a variety of technologies, e.g., NFET, PFET, CMOS, etc., and they are readily applicable to use in forming a variety of devices, including, but not limited to, ASIC's, logic devices, memory devices, etc. With reference to the attached drawings, various illustrative embodiments of the methods and devices disclosed herein will now be described in more detail.

FIG. 1A is a drawing depicting an early point in the manufacturing of illustrative transistor device 10. The device 10 will be formed in and above an active region that is defined in an illustrative bulk semiconductor substrate 12. The substrate 12 may be made of silicon or semiconductor materials other than silicon. Thus, the terms "substrate" or "semiconductor substrate" or "semiconducting substrate" should be understood to cover all bulk semiconductor materials. Additionally, the depiction of the transistor structures in the attached drawings is intended to be representative in nature of any type of transistor device. Thus, the schematic depiction of the FET transistor devices in the drawings should not be considered to be limiting as it relates to the scope of the inventions disclosed herein. In general, the inventions disclosed herein may be employed with any of a variety of different types of semiconductor devices, e.g., transistors, resistors, capacitors, etc., regardless of their shape or configuration or specific materials of construction. For example, although the inventions have been disclosed in the context of the formation of illustrative planar FET transistors, the methods disclosed herein could be equally applied to an integrated circuit product that contained a plurality of FinFET transistors or a combination of planar and FinFET transistor devices.

With continuing reference to FIG. 1A, at this point in the manufacturing process a patterned hard mask layer 14 comprised of, for example, a layer of silicon dioxide 14A, e.g., a pad oxide layer, and a layer of silicon nitride 14B, e.g., a pad nitride layer, have been formed above the substrate 12 by performing known deposition techniques, e.g., chemical vapor deposition (CVD) processes, atomic layer deposition (ALD) processes, etc. The thickness of the layers 14A, 14B may vary depending upon the particular application. The patterned hard mask layer 14 may be patterned by forming a patterned photoresist etch mask (not shown) above the layer 14B and thereafter performing one or more etching processes on the layers 14B, 14A through the patterned photoresist etch mask. The patterned hard mask layer 14 is intended to be representative in nature as it could be comprised of a variety of materials, such as, for example, silicon nitride, silicon oxynitride, hafnium oxide, etc. Moreover, the patterned hard mask layer 14 could be comprised of multiple layers of material. Thus, the particular form and composition of the patterned hard mask layer 14, and the manner in which it is made, should not be considered a limitation of the present invention. The patterned hard mask layer 14 has a plurality of openings 15 that define where isolation structures will be formed in the substrate 12.

Figure 1B:
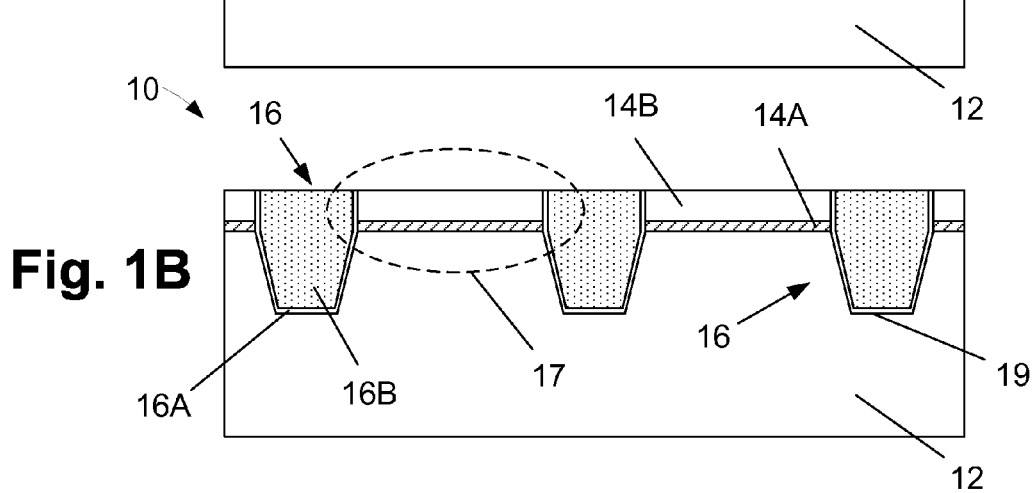

FIG. 1B depicts the device 10 after several process operations were performed to form the illustrative isolation structures 16 in the substrate 12. First, one or more etching processes, such as dry or wet etching processes, were performed on the substrate 12 through the patterned mask layer 14 to form a plurality of trenches 19 in the substrate 12 where the isolation regions 16 will be formed. Thereafter, a conformal deposition process was performed to form a thin layer of insulating material 16A in the trenches 19 and across the device 10. Next, a layer of insulating material 16B was blanket-deposited across the device 10 so as to overfill the trenches 19 with the insulating material 16B. Then, a chemical mechanical polishing (CMP) process was performed that stops on the upper surface of the layer 14B. The CMP process removes the excess amounts of the material layers 16A, 16B positioned outside of the trenches 19. These process operations result in the illustrative isolation regions 16 depicted in FIG. 1B. An interior perimeter or surface of the isolation region 16 defines an isolated substrate region in and above which a transistor will be formed. FIGS. 1C-1H, 1J-1M and 1P are enlarged views of the portion of the substrate 12 enclosed in the dashed line 17 shown in FIG. 1B.

Figure 1C:
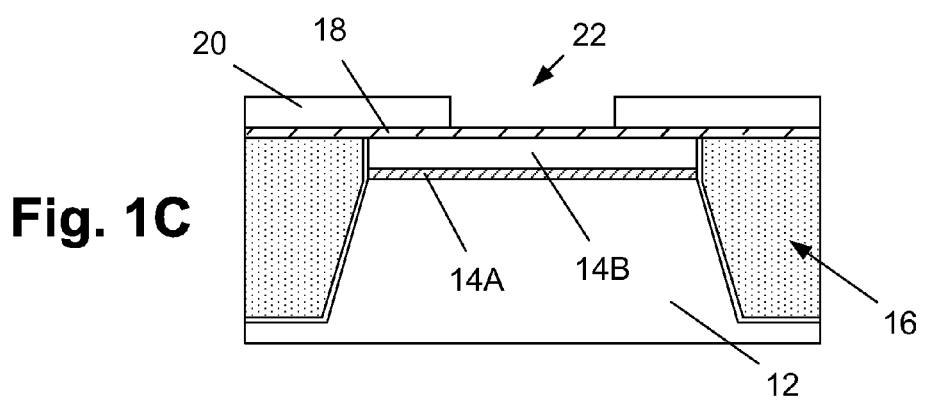

FIG. 1C depicts the device 10 after an etch stop layer 18 and a patterned mask layer 20 have been formed above the substrate 12. The etch stop layer 18 may be comprised of a variety of different materials, e.g., silicon nitride, it may be formed by performing any of a variety of known deposition processes, e.g., a CVD process, and its thickness may vary depending upon the particular application, e.g., 2-4 nm. The patterned mask layer 20 may be comprised of a variety of different materials that may be selectively etched relative to the etch stop layer 18, e.g., silicon dioxide. The patterned mask layer 20 may be initially formed by performing any of a variety of known deposition processes, e.g., a CVD process, and its thickness may vary depending upon the particular application, e.g., 30-50 nm. The patterned hard mask layer 20 may be patterned by performing known photolithographic and etching processes. The patterned hard mask layer 20 has an opening 22 that defines the location where a region of channel semiconductor material will be grown in a region of the original substrate 12, as described more fully below.

Figure 1D:
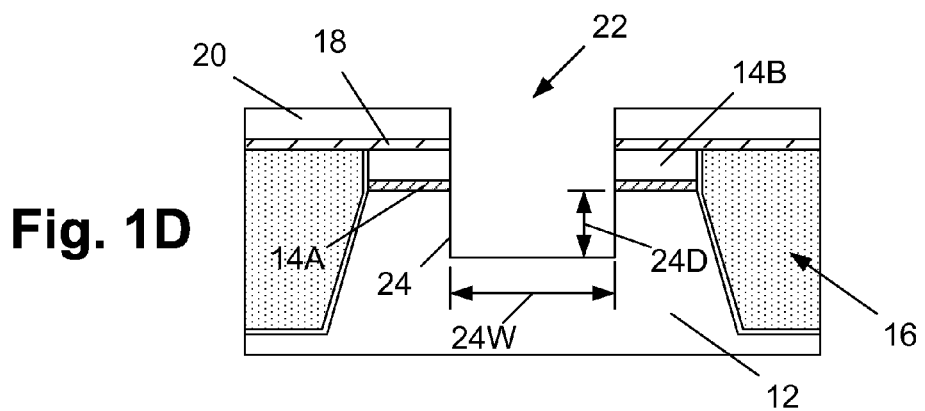

Next, as shown in FIG. 1D, one or more etching processes, such as dry anisotropic etching processes, are performed on the layers 18, 14B, 14A and the substrate 12 through the patterned mask layer 20 to form a trench 24 in the substrate 12. The overall size, shape and configuration of the trench 24 may vary depending on the particular application, and the manner in which it's formed may also vary. In one example, the trench 24 may have a vertical depth 24D that may be about 10-15 nm greater than the junction depth of the transistor device 10 that will be formed above the substrate 12. Using current day technology as an example, the depth 24D may fall within the range of about 30-55 nm relative to the upper surface of the substrate 12. Similarly, based upon current day technology, the lateral width 24W of the trench 24 may fall within a range of about 20-40 nm. In the examples depicted herein, the trench 24 is depicted as being formed by performing one or more anisotropic etching processes that result in the trench 24 having a schematically depicted, generally rectangular configuration. However, as will be recognized by those skilled in the art after a complete reading of the present application, the trench 24 may be formed using a variety of techniques. Thus, the size and configuration of the trench 24, and the manner in which it is made, should not be considered a limitation of the present invention. For ease of disclosure, only the substantially rectangular trench 24 will be depicted in the subsequent drawings. Of course, millions of such trenches 24 and transistor devices will eventually be formed above the substrate 12.

Figure 1E:
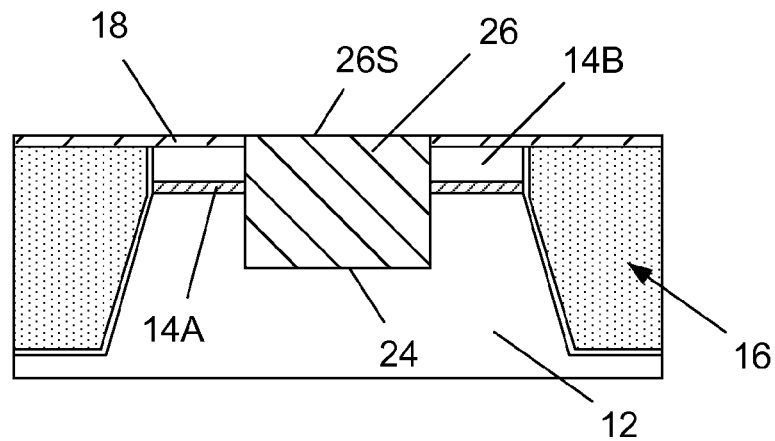

FIG. 1E depicts the device 10 after several process operations were performed. First, a layer of insulating material 26 was blanket-deposited above the device so as to overfill the trench 24. The layer of insulating material 26 may be comprised of a variety of different materials, such as, for example, silicon dioxide, a low-k material (k value less than about 3.3, etc. The layer of insulating material 26 may be initially formed by performing a variety of deposition techniques, e.g., CVD, ALD, etc. In one illustrative embodiment, the layer of insulating material 26 may be a layer of silicon dioxide that is formed by performing a CVD process. Thereafter, a chemical mechanical polishing (CMP) process was performed that stopped on the upper surface of the etch stop layer 18, wherein the insulating material 26 has an upper surface 26S that is substantially planar with the upper surface of the etch stop layer 18. In one embodiment, this CMP process also removes the patterned mask layer 20 (FIG. 1D).

Figure 1F:
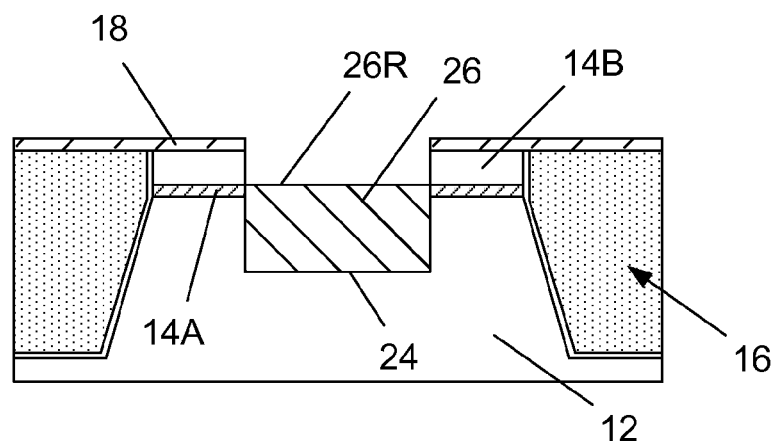

FIG. 1F depicts the device 10 after a selective etch-back process has been performed to recess a portion of the insulating material 26. That is, after the etch-back process is performed, the region of insulating material 26 has a recessed upper surface 26R. In general, the etch-back process depicted in FIG. 1F should be stopped before the recessed upper surface 26R exposes the substrate 12, i.e., the etch-back process should be stopped before the recessed upper surface 26R is below the bottom surface of the layer 14A.

Figure 1G:
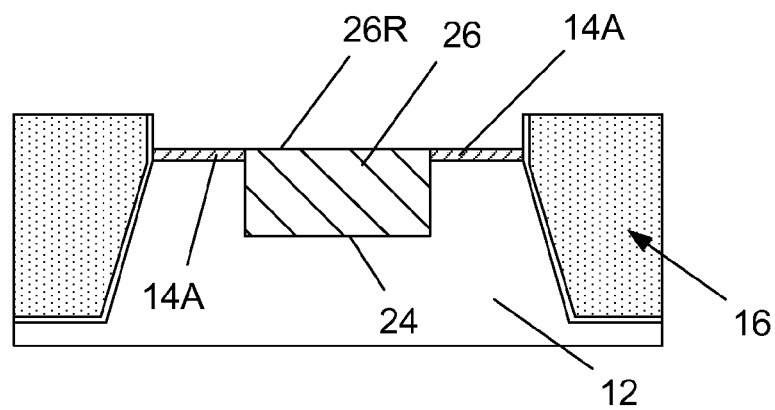

FIG. 1G depicts the device after one or more etching processes, such as dry RIE etching processes, were performed to selectively remove the layers 18 and 14B relative to the surrounding structure. During this operation, the layer 14A acts to protect the substrate 12.

FIG. 1H depicts the device 10 after another etch-back process has been performed to further recess the region of insulating material 26. That is, after this additional etch-back process is performed, the region of insulating material 26 has a further recessed upper surface 26X. The upper surface 26X of the region of insulating material defines a cavity 28 where, as described more fully below, a channel semiconductor material will be formed. By controlling the second etch-back process, the depth of the cavity 28 may be accurately controlled thereby providing a means for producing a layer of channel semiconductor material having a very small and controllable thickness. Based upon current day technology, in one illustrative embodiment, the depth of the cavity 28 may be about 20-50 nm. Note that, during the various etching processes described above and below, portions of the isolation regions 16 will be consumed. However, such consumption of the isolation regions 16 due to these various etching processes is not shown in the attached drawings in order to simplify the presentation of the various inventions disclosed herein.

FIG. 1I is a plan view of the device 10 that corresponds to the cross-sectional view depicted in FIG. 1H, wherein cross-sectional shading of various materials has been maintained to make the different regions and materials more apparent. As can be seen in this drawing, in one embodiment, the region of insulting material 26 is essentially an elongated region of insulating material (in the plan view) positioned in the cavity 28. The isolation region 16 surrounds the substrate material 12 to thereby define the isolated substrate region where the transistor device will be formed. In this particular example, the region of insulating material 26 is an elongated rectangular structure whose long and short dimensions run in the same direction as the gate width (GW) and gate length (GL), respectively, of the transistor device that will be formed above the substrate 12. Note that, in the depicted example, the side surfaces 26S and the bottom surface 26B of the isolated region of insulating material 26 are positioned adjacent the semiconductor material 12.

Figure 1J:
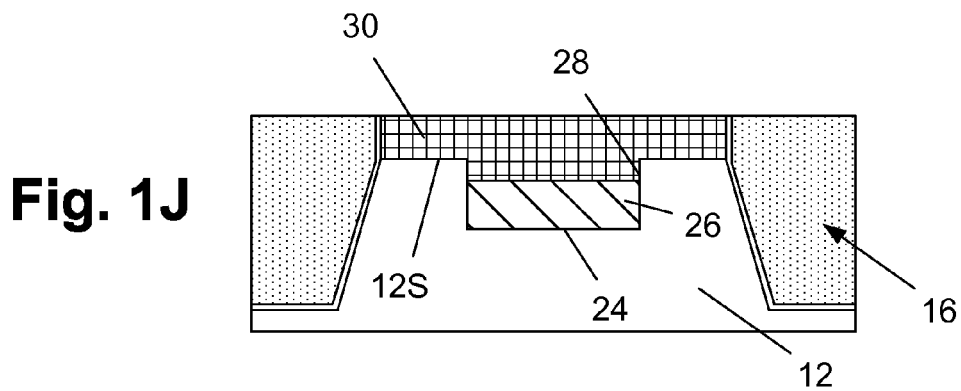

FIG. 1J depicts the device 10 after several process operations were performed. First, a layer of channel material 30 was blanket-deposited above the device and the isolation regions 16 so as to overfill the cavity 28. The layer of channel material 30 may be comprised of a variety of different materials, such as, for example, amorphous silicon, polysilicon, a III-V material or compounds thereof, compound semiconductor materials such as, for example, InAs, GaAs, InP, high mobility materials, etc. The layer of channel material 30 may be formed by performing a variety of deposition techniques, e.g., epitaxial deposition via CVD, etc. In one illustrative embodiment, the layer of channel material 30 may be a layer of amorphous silicon that is formed by performing any of a variety of known epitaxial deposition processes. After the layer of channel material 30 was initially blanket-deposited across the device, a chemical mechanical polishing (CMP) process was performed that stopped on the upper surface of the isolation regions 16, as shown in FIG. 1J.

Figure 1K:
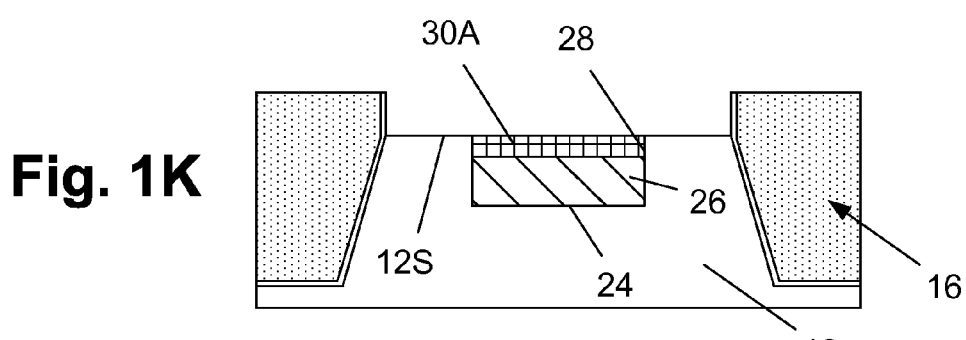

FIG. 1K depicts the device 10 after a selective etch-back process has been performed on the layer of channel material 30 so as to define a region of the channel material 30A positioned in the cavity 28.

Figure 1L:
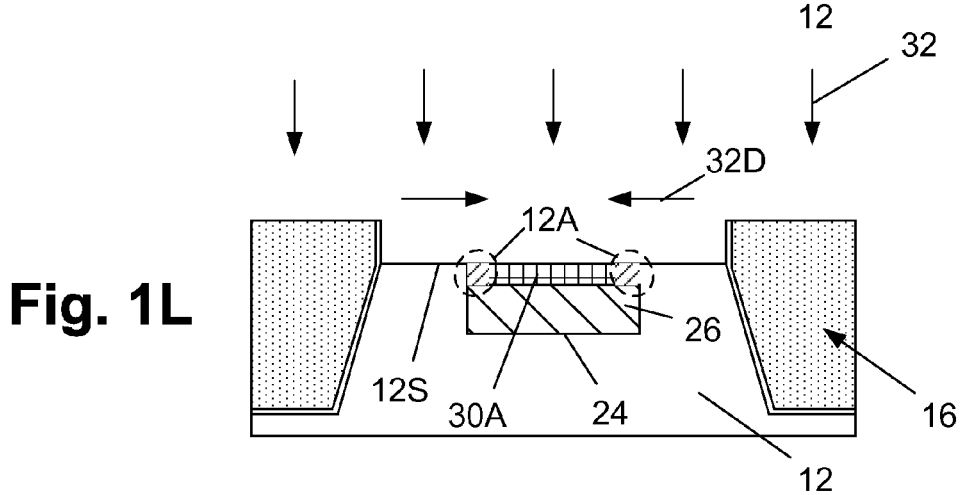
Figure 1M:
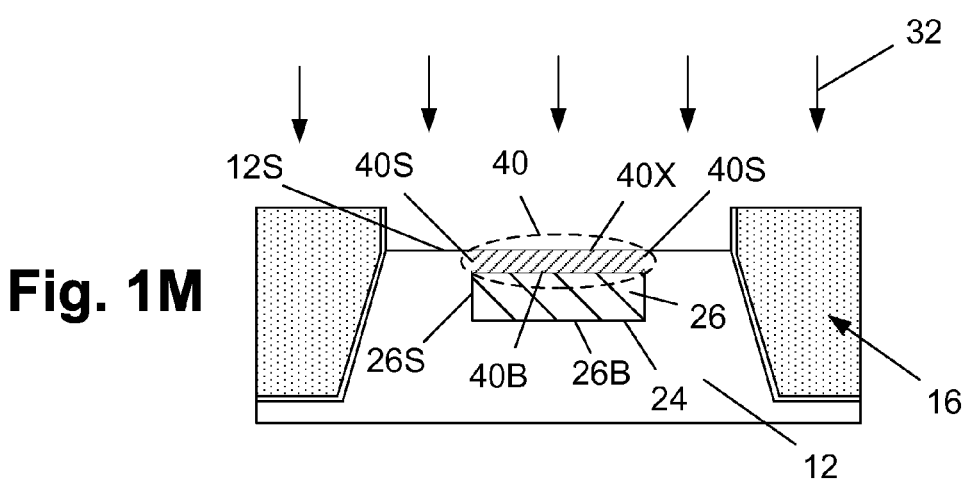

As shown in FIGS. 1L-1M, the next process operation involves performing a re-crystallization anneal process 32 to convert the region of the channel material 30A into a crystalline semiconductor material wherein the substrate 12 will serve as the seed for the formation of the crystalline material. More specifically, during the re-crystallization anneal process 32, the region of the channel material 30A will gradually transition from a non-crystalline material to a crystalline material. The transition into a crystalline material will begin where the region of the channel material 30A contacts the substrate 12, i.e., the sidewalls of the cavity 28, and move laterally inward, as indicated by the arrows 32D, as the re-crystallization anneal process 32 proceeds. FIG. 1L depicts the device shortly after the re-crystallization anneal process 32 process was started. Note the transformation of the region of the channel material 30A into a crystalline material (as indicated by different cross-sectional shading) in the regions enclosed in the dashed lines 12A. FIG. 1M depicts the device 10 after the re-crystallization anneal process 32 has been completed. At this point note that substantially the entire region of the channel material 30A has been re-crystallized to thereby form channel semiconductor material 40, with an upper surface 40X and side surfaces 40S, positioned above the isolated region of insulation material 26 positioned in the substrate 12 between the isolation regions 16 and under at least a portion of the channel semi-conductor material 40. Note that, in the depicted example, the side surfaces 26S and the bottom surface 26B of the isolated region of insulating material 26 are positioned adjacent the semiconductor material 12, while the top surface of the isolated region of insulating material 26 is positioned adjacent the bottom surface 40S of the channel semiconductor material 40. In effect, the sides, bottom and top of the isolated region of insulating material is effectively surrounded by a combination of the semiconductor material 12 and the channel semiconductor material 40. The channel semiconductor material 40 may be comprised of silicon, silicon/germanium (SiGe), a III-V material or compounds thereof, compound semiconductor materials such as, for example, InAs, GaAs, InP, high mobility materials, etc. The temperature and duration of the re-crystallization anneal process 32 may vary depending upon the particular application. In one illustrative embodiment, the re-crystallization anneal process 32 may be performed at a temperature of about 600-900° C. for a duration of at least 4-10 minutes in a nitrogen ambient.

FIG. 1N is a plan view of the device 10 that corresponds to the cross-sectional view depicted in FIG. 1M, wherein cross-sectional shading of various materials has been maintained to make the different regions and materials more apparent. As can be seen in this drawing, in one embodiment, the channel semiconductor material 40 is (in the plan view) essentially an elongated region of epitaxially grown semiconductor material that is positioned in the cavity 28 above the isolated region of insulating material 26. In this particular example, the side surfaces 40S of the channel semiconductor material 40 are positioned adjacent the material of the substrate 12, while the bottom surface 40B (see FIG. 1M) is positioned adjacent the upper surface of the isolated region of insulating material 26. As before, the isolation region 16 surrounds the substrate material 12 to thereby define the active region where the transistor device will be formed. In this particular example, the region of the channel semiconductor material 40 is an elongated rectangular structure whose long and short dimensions run in the same direction as the gate width (GW) and gate length (GL), respectively, of the transistor device that will be formed above the substrate 12.

Figure 1O:
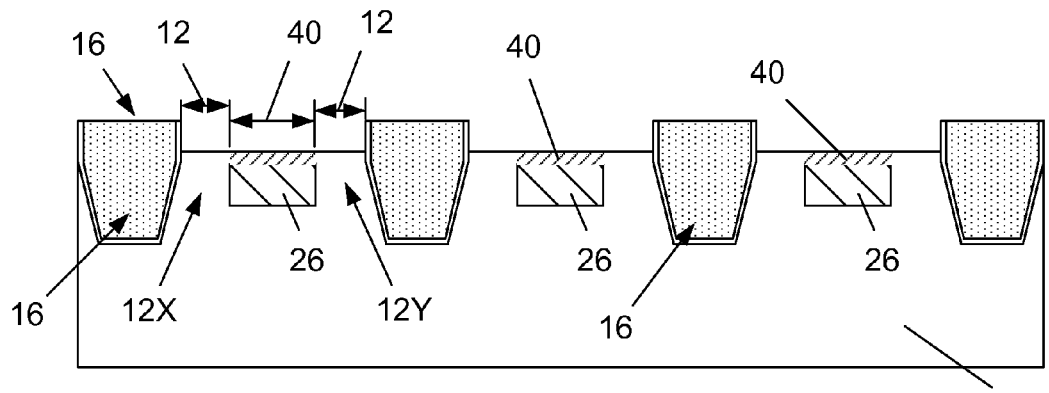

FIG. 1O depicts a broader view of the substrate 12 wherein multiple regions of the channel semiconductor material 40 have been formed above the isolated regions of insulation material 26 using the methods disclosed above. Note that, in this cross-sectional view, which is parallel to the gate length direction (GL) of the transistor device 10, in the active region defined by the isolation region 16, the channel semiconductor material 40 is positioned between two regions of the original semiconductor substrate material 12, i.e., the side surfaces 40S of the channel semiconductor material 40 are positioned adjacent the material of the substrate 12. Also, at least portions, and in some embodiments the entirety of the channel semiconductor material 40 is positioned above the isolated regions of insulating material 26 that is positioned in the cavity 28 formed in the substrate 12. Stated another way, at least one cross-section of the substrate 12 comprises regions 12X, 12Y of the isolated substrate region positioned laterally between the side surfaces 26S of the region of insulating material 26 and the isolation structure 16. Similarly, at least one cross-section of the substrate 12 comprises regions 12X, 12Y of the isolated substrate region positioned laterally between the side surfaces 40S of the semiconductor material 40 and the isolation structure 16.

Figure 1P:
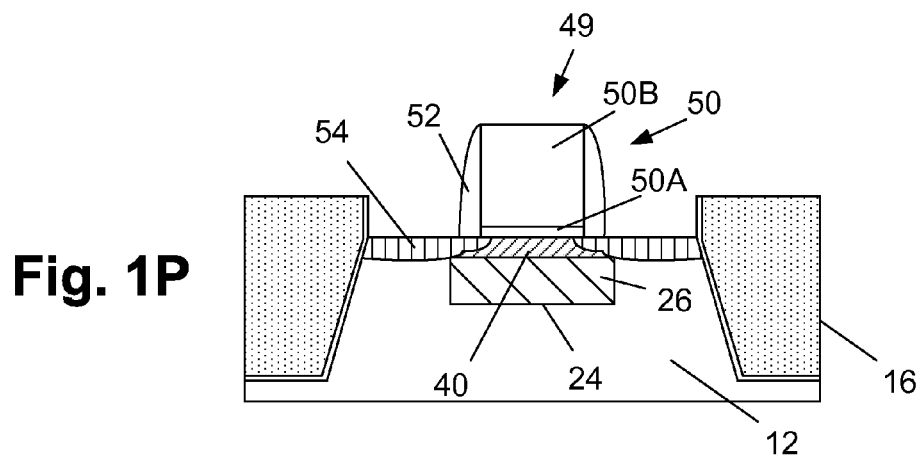

At this point in the fabrication process, any type of semiconductor device may be formed above the active regions shown in FIG. 1O. FIG. 1P depicts the example where an illustrative planar FET transistor 49 has been formed above one of the active regions in the substrate 12. The illustrative transistor 49 includes a schematically depicted gate structure 50 comprised of an illustrative gate insulation layer 50A and an illustrative gate electrode 50B. A gate cap layer (not shown) may also be formed above the illustrative gate electrode layer 50B. The transistor 49 is also comprised of illustrative sidewall spacer structures 52 and illustrative source/drain regions 54. The transistor 49 may be either an N-type transistor or a P-type transistor. The gate insulation layer 50A may be comprised of a variety of different materials, such as, for example, silicon dioxide, a so-called high-k (k greater than 7) insulation material, etc. Similarly, the gate electrode 50B may also be of a material such as polysilicon or amorphous silicon, or it may be comprised of one or more metal layers that act as the gate electrode 50B. As will be recognized by those skilled in the art after a complete reading of the present application, the gate structure 50 of the device 49 depicted in the drawings, i.e., the gate insulation layer 50A and the gate electrode 50B, is intended to be representative in nature. That is, the gate structure 50 may be comprised of a variety of different materials and it may have a variety of configurations, and the gate structure 50 may be made using either so-called "gate-first" or "gate-last" techniques. The sidewall spacer structure 52 is also intended to be representative of any type or arrangement of spacers/liner layers that are commonly employed in manufacturing transistor devices, e.g., the spacer structure 52 may be comprised of two or more spacers with or without various liner layers. The manner in which the spacer structure 52 and the gate structure 50 of the transistor 49 are made are well known to those skilled in the art.

Figure 1Q:
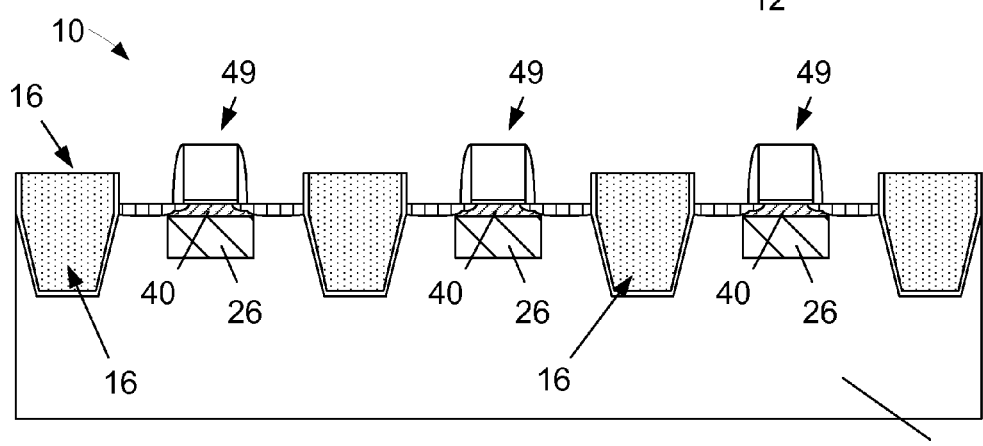
Figure 1R:
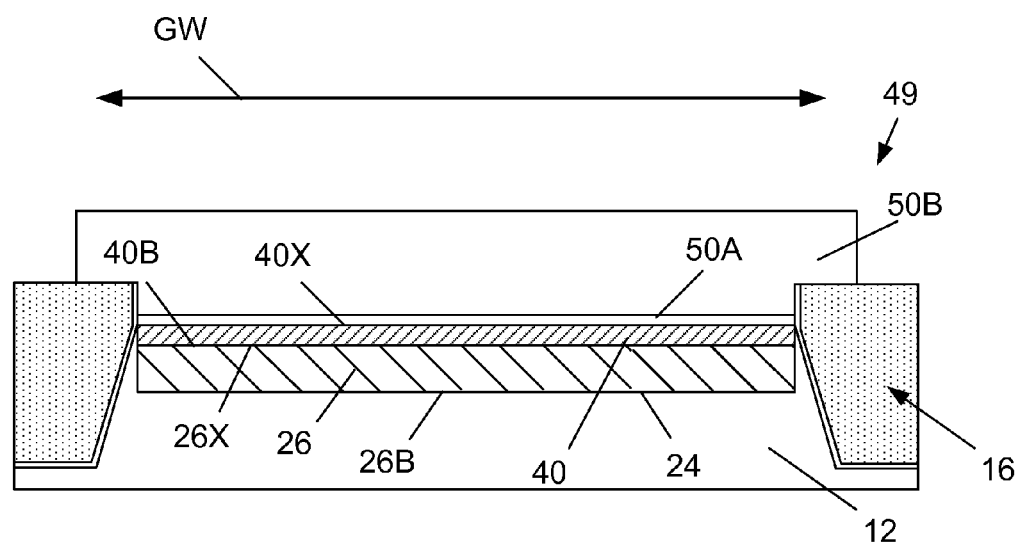

FIG. 1Q depicts a broader view of the substrate 12 wherein multiple transistor devices 49 have been formed above the regions of the channel semiconductor material 40 using the methods disclosed above. FIG. 1R is a cross-sectional view of the transistor 49 in the gate width (GW) direction. At the point of fabrication depicted in FIGS. 1P-1Q, traditional manufacturing operations may be performed to complete the formation of the device. For example, conductive contacts may be formed so as to electrically contact the gate electrodes and source/drain regions of the transistor devices, and various metallization layers may be subsequently formed above the device 10 using known processing techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a bulk semiconductor substrate, comprising:
    forming an isolation region in said bulk semiconductor substrate wherein said isolation region defines an isolated substrate region;
    forming a trench in said isolated substrate region;
    completely filling said trench with an insulating material;
    removing an upper portion of said insulating material from said trench so as to form a region of insulating material that is recessed in said trench, said region of insulating material having an upper surface that is at a level that is below a level of an upper surface of said isolated substrate region; and
    forming a semiconductor material within said trench and above said upper surface of said region of insulating material, wherein said semiconductor material has an upper surface that is substantially planar with said upper surface of said isolated substrate region.

2. The method of claim 1, wherein said bulk semiconductor substrate is comprised of silicon.

3. The method of claim 1, wherein said semiconductor material is comprised of one of silicon, silicon/germanium, or a III-V material or compounds thereof.

4. The method of claim 1, wherein forming said semiconductor material within said trench and above said upper surface of said region of insulating material comprises:
    forming a region comprised of amorphous silicon, polysilicon or a III-V material or compounds thereof within said trench and above said upper surface of said region of insulating material wherein said region comprised of amorphous silicon, polysilicon or a III-V material or compounds thereof has an upper surface that is substantially planar with said upper surface of said isolated substrate region; and
    performing a re-crystallization anneal process to convert said region comprised of amorphous silicon, polysilicon or a III-V material or compounds thereof into said semiconductor material.

5. The method of claim 1, wherein forming a semiconductor material within said trench and above said upper surface of said region of insulating material comprises:
    depositing an initial layer of material comprised of amorphous silicon, polysilicon or a III-V material or compounds thereof so as to overfill said trench;
    performing a chemical mechanical polishing process on said initial layer; and
    after performing said chemical mechanical polishing process, performing at least one etching process on said initial layer of material so as to define a region of said initial layer of material having an upper surface that is substantially planar with said upper surface of said isolated substrate region.

6. The method of claim 5, further comprising, after performing said etching process, performing a re-crystallization anneal process to convert said region of said initial layer of material into said semiconductor material.

7. The method of claim 6, wherein said re-crystallization anneal process is performed at a temperature that falls within the range of about 600-900° C.

8. The method of claim 1, further comprising forming a transistor in and above said isolated substrate region.

9. A method of forming a bulk silicon substrate, comprising:
    forming an isolation region in said bulk silicon substrate, wherein said isolation region defines an isolated substrate region;
    forming a trench in said isolated substrate region;
    forming a region of an insulating material in said trench, said region of insulating material having an upper surface that is at a level that is below a level of an upper surface of said isolated substrate region;
    forming a region comprised of amorphous silicon, polysilicon or a III-V material or compounds thereof within said trench and above said upper surface of said region of insulating material, wherein said region comprised of amorphous silicon, polysilicon or a III-V material or compounds thereof has an upper surface that is substantially planar with said upper surface of said isolated substrate region; and
    performing a re-crystallization anneal process to convert said region comprised of amorphous silicon, polysilicon or a III-V material or compounds thereof into a semiconductor material that has an upper surface that is substantially planar with said upper surface of said isolated substrate region.

10. The method of claim 9, wherein forming said region of insulating material in said trench comprises:
    depositing said insulating material so as to overfill said trench;
    performing a chemical mechanical polishing process on said deposited insulating material; and
    after performing said chemical mechanical polishing process, performing at least one etching process on said insulating material so as to define said region of insulating material that has said upper surface that is at said level that is below said level of said upper surface of said isolated substrate region.

11. The method of claim 9, further comprising forming a transistor in and above said isolated substrate region.

12. The method of claim 11, wherein said re-crystallization anneal process is performed at a temperature that falls within the range of about 600-900° C.

13. A method of forming a bulk silicon substrate, comprising:
    forming an isolation region in said bulk silicon substrate, wherein an interior perimeter of said isolation region defines an isolated substrate region;
    forming a trench in said isolated substrate region;
    depositing an insulating material so as to overfill said trench;

performing a first chemical mechanical polishing process on said deposited insulating material;

after performing said first chemical mechanical polishing process, performing at least one first etching process on said insulating material so as to define a region of insulating material within said trench that has an upper surface that is at a level that is below a level of an upper surface of said isolated substrate region;

depositing an initial layer of material comprised of amorphous silicon, polysilicon or a III-V material or compounds thereof so as to overfill said trench;

performing a second chemical mechanical polishing process on said initial layer of material;

after performing said second chemical mechanical polishing process, performing at least one second etching process on said initial layer of material so as to define a region of said initial layer of material having an upper surface that is substantially planar with said upper surface of said isolated substrate region; and performing a re-crystallization anneal process to convert said region of said initial layer of material into a semiconductor material.

14. The method of claim 13, further comprising forming a transistor in and above said isolated substrate region.

15. The method of claim 13, wherein said re-crystallization anneal process is performed at a temperature that falls within the range of about 600-900° C.

16. A method, comprising:
forming an isolation region in a bulk semiconductor substrate, wherein said isolation region defines an isolated substrate region;

forming a trench in said isolated substrate region;

forming a region of insulating material in said trench, said region of insulating material having an upper surface that is at a level that is below a level of an upper surface of said isolated substrate region; and forming a semiconductor material within said trench and above said upper surface of said region of insulating material, wherein forming said semiconductor material within said trench and above said upper surface of said region of insulating material comprises:
depositing an initial layer of material comprised of amorphous silicon, polysilicon or a III-V material or compounds thereof so as to overfill said trench;
performing a chemical mechanical polishing process on said initial layer of material;
after performing said chemical mechanical polishing process, performing at least one etching process on said initial layer of material so as to define a region of said initial layer of material having an upper surface that is substantially planar with said upper surface of said isolated substrate region; and
after performing said etching process, performing a re-crystallization anneal process to convert said region of said initial layer of material into said semiconductor material.

17. The method of claim 16, wherein said bulk semiconductor substrate is comprised of silicon.

18. The method of claim 16, further comprising forming a transistor in and above said isolated substrate region.

19. A method, comprising:
forming an isolation region in a bulk semiconductor substrate, wherein said isolation region defines an isolated substrate region;

forming a trench in said isolated substrate region;

depositing an insulating material so as to overfill said trench;

performing a chemical mechanical polishing process on said deposited insulating material;

after performing said chemical mechanical polishing process, performing at least one etching process on said insulating material so as to define a region of said insulating material in said trench that has an upper surface that is at a level that is below said level of said upper surface of said isolated substrate region; and forming a semiconductor material within said trench and above said upper surface of said region of insulating material, wherein said semiconductor material has an upper surface that is substantially planar with said upper surface of said isolated substrate region.

20. The method of claim 19, wherein said bulk semiconductor substrate is comprised of silicon.

21. The method of claim 19, wherein said semiconductor material is comprised of one of silicon, silicon/germanium, or a III-V material.

22. The method of claim 19, wherein forming said semiconductor material within said trench and above said upper surface of said region of insulating material comprises:
forming a material region comprised of amorphous silicon, polysilicon or a III-V material within said trench and above said upper surface of said region of insulating material wherein said material region has an upper surface that is substantially planar with said upper surface of said isolated substrate region; and
performing a re-crystallization anneal process to convert said material region into said semiconductor material.

23. The method of claim 19, wherein forming a semiconductor material within said trench and above said upper surface of said region of insulating material comprises:
depositing an initial layer of material comprised of amorphous silicon, polysilicon or a III-V material so as to overfill said trench;
performing a chemical mechanical polishing process on said initial layer of material; and
after performing said chemical mechanical polishing process, performing at least one etching process on said initial layer of material so as to define a region of said initial layer of material having an upper surface that is substantially planar with said upper surface of said isolated substrate region.

24. The method of claim 23, further comprising, after performing said etching process, performing a re-crystallization anneal process to convert said region of said initial layer of material into said semiconductor material.

25. The method of claim 24, wherein said re-crystallization anneal process is performed at a temperature that falls within the range of about 600-900° C.

26. The method of claim 19, further comprising forming a transistor in and above said isolated substrate region.

27. The method of claim 19, wherein forming said semiconductor material comprises performing an epitaxial growth process.

* * * * *